United States Patent [19]
Heise

[11] Patent Number: 6,124,772
[45] Date of Patent: Sep. 26, 2000

[54] CONTROL UNIT

[75] Inventor: Andreas Heise, Morfelden, Germany

[73] Assignee: Continental Teves AG & Co. OHG, Germany

[21] Appl. No.: 09/155,604

[22] PCT Filed: Mar. 26, 1997

[86] PCT No.: PCT/EP97/01532

§ 371 Date: Jun. 8, 1999

§ 102(e) Date: Jun. 8, 1999

[87] PCT Pub. No.: WO97/36773

PCT Pub. Date: Oct. 9, 1997

[30] Foreign Application Priority Data

Mar. 30, 1996 [DE] Germany ............................ 196 12 907

[51] Int. Cl.[7] .................................................. H01H 9/02
[52] U.S. Cl. ......................................... 335/202; 303/119.2
[58] Field of Search ..................................... 439/528, 243; 303/119.1–119.3; 381/600, 601, 622, 626, 796, 730, 752, 765, 807, 812; 174/52.1, 260; 335/202

[56] References Cited

U.S. PATENT DOCUMENTS

| | | |
|---|---|---|
| 3,545,080 | 12/1970 | Evans . |
| 5,386,337 | 1/1995 | Schoettl . |
| 5,513,905 | 5/1996 | Zeides et al. .......................... 303/119.2 |
| 5,785,394 | 7/1998 | Volpe et al. ............................ 303/119.2 |
| 5,892,659 | 4/1999 | Cooper et al. ............................ 361/727 |
| 5,921,639 | 7/1999 | Hosoya ................................. 303/119.2 |
| 5,941,282 | 8/1999 | Suzuki et al. .......................... 251/119.1 |

FOREIGN PATENT DOCUMENTS

| | | |
|---|---|---|
| 0373551 | 6/1990 | European Pat. Off. . |
| 0492110 | 7/1992 | European Pat. Off. . |
| 0658463 | 6/1995 | European Pat. Off. . |
| 118794 | 2/1965 | Germany . |
| 3535074 | 4/1987 | Germany . |
| 9303646 | 6/1993 | Germany . |
| 4410285 | 9/1995 | Germany . |
| 89/10286 | 11/1989 | WIPO . |
| 92/12878 | 8/1992 | WIPO . |

OTHER PUBLICATIONS

Search Report of the German Patent Office for Application 196 12 907.9. (No Date).
Japanese Abstract No. 4–278597 dated May, 10, 1992.
Article "Toleranzen und Kriterien fur die EinpreBtechnik an Leiterplatten" by Dieter G. Weiss (No Date).

*Primary Examiner*—Lincoln Donovan
*Attorney, Agent, or Firm*—Rader, Fishman & Grauer PLLC

[57] ABSTRACT

The present invention discloses a controller unit wherein coils of the electromagnets of a hydraulic brake system are arranged in a frame. The controller unit also has a printed circuit board having smaller dimensions than the frame. The printed circuit board includes through-contact holes which accept the ends of the lead wires for the coils, the ends being configured as press-in pins. The plug contacts of the printed circuit board are arranged so as to achieve an optimum component layout on the printed circuit board, and the lead wires are guided in the controller according to this condition.

7 Claims, 3 Drawing Sheets

CONTROL UNIT

TECHNICAL FIELD

The present invention relates to a brake control unit and more particularly to a brake control unit which includes coils for electromagnetically actuatable valves of a hydraulic brake system.

BACKGROUND OF THE INVENTION

A controller unit of this general type is described in U.S. Pat. No. 5,386,337. The lead wires extend in a potting composition by which the coils are also retained in the housing of the controller units. Only the ends of the lead wires project from the partition wall in the controller unit and are soldered to the printed circuit board. This necessitates a separate production step which involves intricate handling because the components which have already been fitted and soldered to the printed circuit board must not be damaged in this soldering operation. This makes a complicated soldering process necessary or requires the components to be spaced from the location where the ends of the lead wires are being soldered to the printed circuit board. Therefore, the printed circuit board has correspondingly large square dimensions.

The lead wires of two coils, arranged in pairs relative to each other, are deflected so that the ends of the wires are arranged in a row. The current-conveying elements in the printed circuit board and the positioning of the components must be adapted to this arrangement.

European patent application No. 37355 discloses a controller unit wherein the lead wires of the coil extend to a multipoint connector, and the mating connections of the printed circuit board are arranged in a counter plug. The printed circuit board is arranged in a lid, and the plug connection is established when the lid is mounted. This arrangement is relatively complicated because the connections of the printed circuit board and the lead wires of the coils must be led to a multipoint connector.

The above-mentioned European patent application also discloses an arrangement wherein an intermediate ceiling which includes conductor paths is provided in the controller unit. Plugs are arranged on the bottom side of the partition wall and cooperate with guide pins which project from the coil casings. The conductor paths in the partition wall are uncovered at a point so that a connection can be made to the printed circuit board which is attached in the lid of the housing.

A valve control device is disclosed in European patent application No. 658 463 wherein the magnetic coils are inserted into an aperture of the controller unit and retained therein by way of a snap-type locking engagement achieved in the following fashion:

Several arms are attached to each magnetic coil and embrace the coil like a spider. Detents are provided at their ends. Mating indentations are recessed in the apertures permitting snap-type engagement by the detents. This arrangement achieves a slightly swinging accommodation of the magnetic coils so that they may become aligned when mounted onto a valve dome in which the magnetic armature is guided.

The press-in technique for press-in pins in printed circuit boards is described in the leaflet of ept-Gugelhoer Peiting GmbH & Co. Elektronische Praezisions-Technik titled, 'ept Einpresstechnik, Tcom Press', August 1990. This concerns especially solid or formed press-in pins which, in terms of their strength, are adapted to the requirements of relatively great press-in and press-out forces.

An object of the present invention is to design the controller unit of the generic type so that the connection between the coils and the printed circuit board can be carried out quickly, devoid of mechanical and thermal stress, and under the condition of a simple tolerance compensation. The previous coil lead wires are maintained. Another objective is to provide the printed circuit board with the smallest possible square dimensions.

When, in addition, not only the ends of the lead wires of the coils are designed as press-in pins but also the connection to a plug or an electric motor, the printed circuit board is only required to be pressed onto the press-in pins arranged in one plane in order to produce a reliable electrical contact between the lead wires and the printed circuit board.

Further embodiments of the idea of the present invention are described in the subclaims. It is especially important that the forces which are caused in the press-in operation will not be introduced into the coils and that mechanical stress which occurs, for example, in thermal expansions of the materials, will not take effect on the press-in contacts, or only to a certain extent. It is suggested to this end that the lead wires be bent off above the partition wall in the controller unit housing so that the ends of the lead wires are offset with respect to the associated coil. It is preferred that the ends of the lead wires are held in a plastic holder which bears against a base on the partition wall. This base takes up all forces occurring in the press-in operation. In addition, the base causes the ends of the lead wires to exactly adopt a position where they are in alignment with the corresponding insertion holes in the printed circuit board.

As an alternative of the plastic holder, the ends of the lead wires may include locking or fixing elements which, preferably, are designed integrally with the wires and are snap fitted to matingly shaped accommodations on the partition wall.

The lead wires extend uncovered or, possibly, in guides above the partition wall. The advantage is that tolerances can be compensated. The position of the ends of the lead wires is determined by the position of the base so that tolerances in the lengths of the lead wires can be compensated for by slightly bending the wires.

Further, the lead wires or their length and orientation with respect to the coil are aligned to be identical for all coils. This must, of course, be taken into consideration in the positioning of the plugs on the printed circuit board.

DETAILED DESCRIPTION OF THE PREFERRED EMBODIMENTS

Figure 1A:
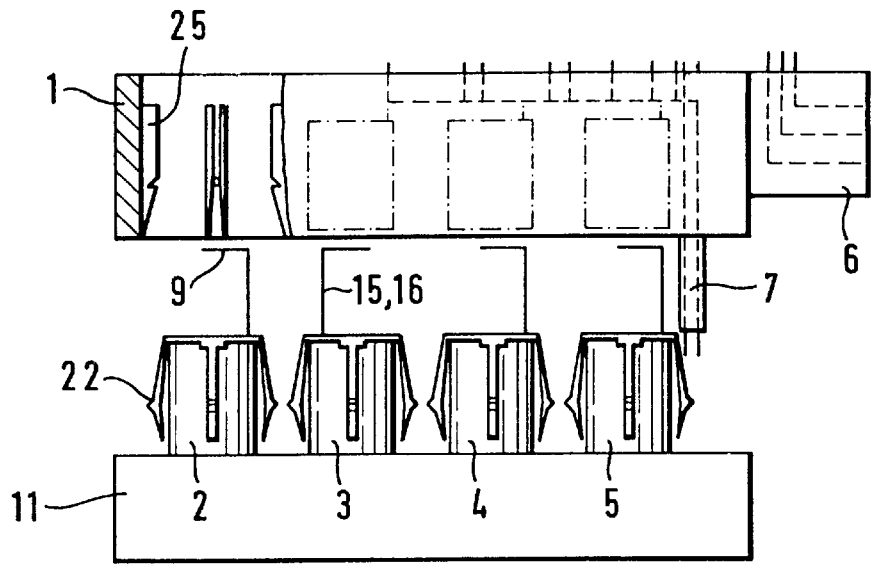
FIG. 1 is a view of the principle arrangement of coils in a frame with an associated printed circuit board, with a possible way of assembly being simultaneously shown.

FIG. 1 shows a controller unit and a frame 1 in which a plurality of coils 2, 3, 4, 5 are arranged. The number of coils is dictated by the number of the electromagnetic valves required in a brake system.

Arranged on frame 1 is a plug 6 to which various sensors or current supply devices can be connected. In addition, there is a connection 7 to an electric motor 12. As can be seen, the ends 9 of the lines to plug 6, connection 7, and coils 2, 3, 4, 5 are placed in one plane, and the square dimensions of the area where the connection ends are provided are smaller than the square dimensions of frame 1.

A printed circuit board 8 on which the electronic devices of the controller are mounted (not shown) has through-contact holes into which the ends 9 of the line can be inserted which are configured as press-in pins. When the printed circuit board 8 is pressed onto the ends, the pins are urged into the through-contact holes, whereby a connection is constituted by way of the socalled press-in technique. This technique is per se known in the art. For example, there is a number of suggestions how to configure the press-in pins or the through-contact holes (see hereinabove).

Each of the coils 2, 3, 4, 5 includes three or four arms 22 which embrace the coil body like a spider and have detents on their outside surface. The arms extend alongside the coil body, and the detent is placed roughly at half the height. Guides 25 are provided in the frame 1 and have a corresponding indentation.

In general, the coils 2, 3, 4, 5 are slipped into the frame 1 from below, i.e., from the side facing the valve block. Arms 22 slide into the guides 25 until the detents snap into the indentations. This provides a pendulum-type suspension for the valve coils so that they can still move easily into alignment with respect to the valve domes of the valve block 11.

As can be seen in FIG. 1a, the lead wires 15, 16, having press-in contacts 9 designed at their ends, are aligned in an axial direction prior to the assembly, and they extend through corresponding holes in the partition wall 10 when the magnetic coils are mounted.

Figure 1B:
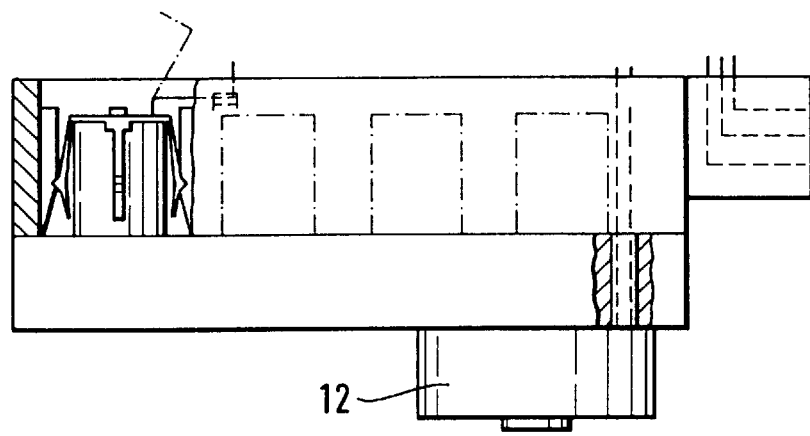

As soon as the valve coils are suspended in the frame, the lead wires 15, 16 (as can be seen in FIG. 1b) are bent laterally, so that the ends come to abut on bases, as will be explained hereinbelow.

Figure 1C:
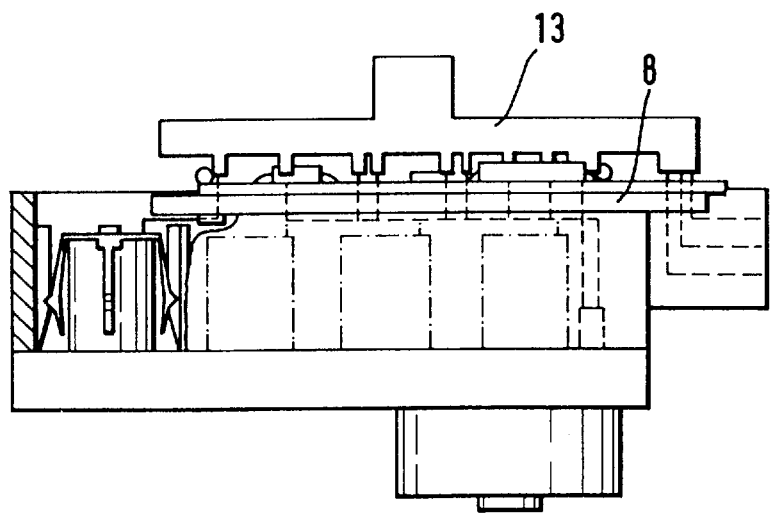

Subsequently, the printed circuit board 8 can be urged onto the press-in contacts 9, as is shown in FIG. 1c, with the result that a conductive connection is established between the electronic devices on the printed circuit board 8 and the coils, the motor and the cable assembly plug.

Figure 2:
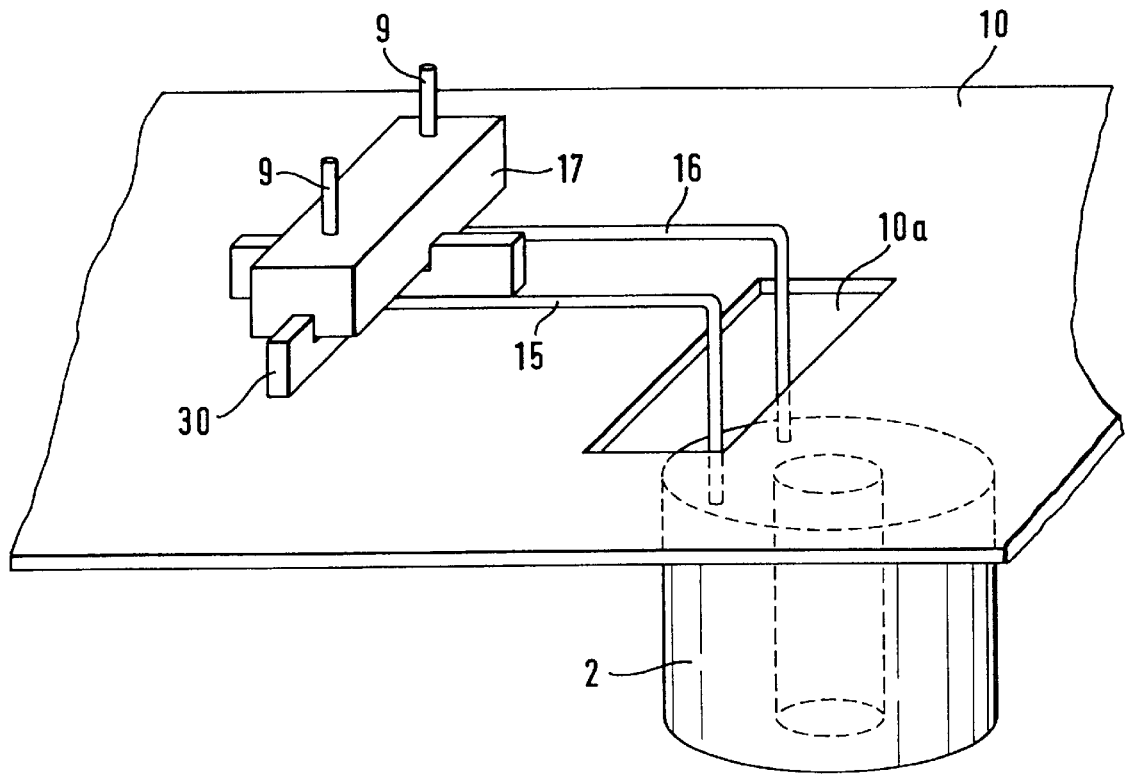
FIG. 2 is a view of a coil with the associated lead wires and a partition wall (shown schematically).
Figure 3:
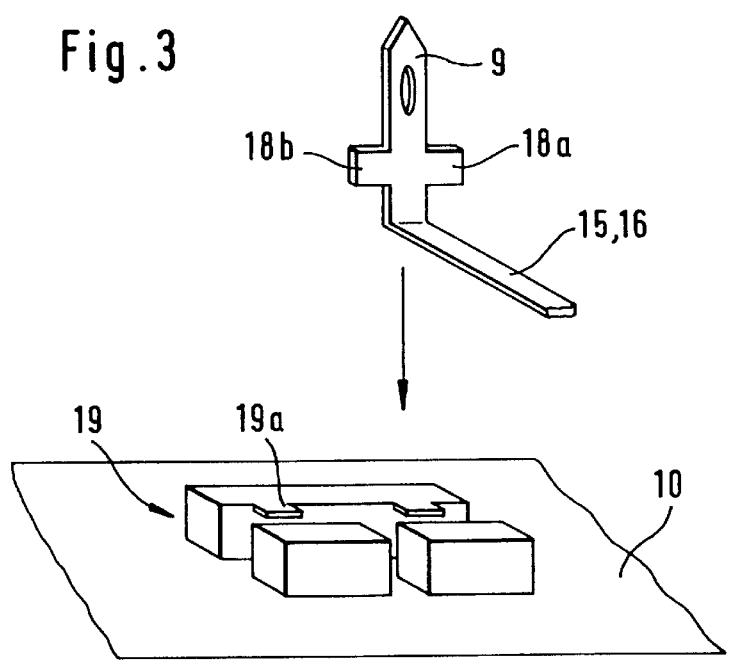
FIG. 3 is a view of the end of a lead wire with locking arms and the associated accommodation recess.

FIG. 2 shows a coil 2 having two lead wires 15, 16 which are deflected twice, their ends 9 being configured as press-in pins. The press-in pin may be designed so that the end 9 is thickened like a barrel and is serrated so that a frictional and gas-tight connection is established with the mating contact in the printed circuit board. In a different configuration of the press-in pin 8, the latter has the shape of a needle eye, and the eye is wider than the wire. The two connecting ends of a coil are interconnected by a plastic holder 17.

In order to make the ends of the lead wires adopt the correct position in relation to the printed circuit board, the following procedure is suggested as will be illustrated in more detail in FIG. 2. FIG. 2 is a schematic view of the partition wall 10 in the controller housing. Coils 2 are arranged below the partition wall 10, the lead wires extend above it. The lead wires are inserted along with the plastic holder through a hole 10a in the partition wall and bent laterally above the hole so that portions of the lead wires 15, 16 extend in parallel to the partition wall 10. The openings 10a in the partition wall 10 must have a correspondingly large size. The plastic holder 17 bears against a base 30 which is integrally designed with the partition wall 10.

The base comprises stop elements by which the plastic holder 17 is aligned and fixed in the plane of the partition wall 10. Thus, the bases determine the orientation of the ends of the lead wires so that the respective ends are in alignment with the corresponding press-in holes in the printed circuit board 8.

The advantage of this arrangement is that during the press-in operation the forces are not introduced into the coil 2 but rather into the partition wall. The lead wires 15, 16 laid uncovered on the surface of the partition wall 10 cause a compensation of tolerances, because the wires tend to be easily bent if the length of the wires is not in conformity with the distance between the coil 2 and the base 30, or the coils have height-related tolerances.

In lieu of plastic holder 17, each end of a lead wire 15, 16 may include laterally projecting arms 18a, 18b below the press-in contact 9. The arms are formed integrally with the lead wires 15, 16.

Mounted on the partition wall 10 is a base 19 with catching hook 19a which accepts the deflected end of the lead wire 15, 16. The catching hooks 19a grip over the arms 18a, 18b and reliably fix the end of the wire.

When accepting certain limitations with respect to the plane arrangement of the devices on the printed circuit board, all coils 2 and the associated lead wires 15, 16 may have the same design, especially with respect to the distance between the ends 9 and the coil body.

Figure 4:
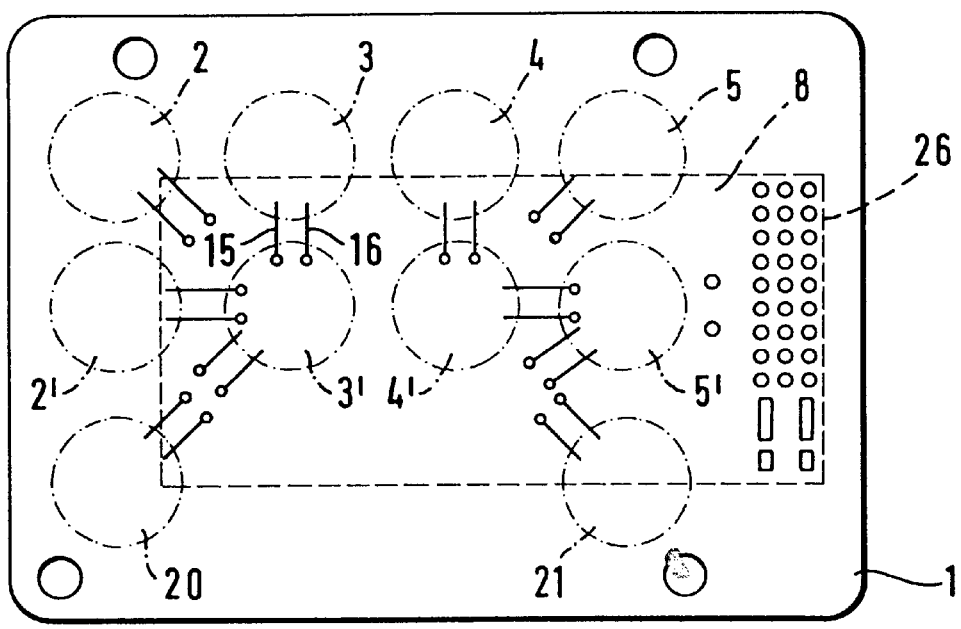
FIG. 4 is a wiring diagram.

FIG. 4 shows a typical arrangement of coils 2, 3, 4, 5; 2', 3', 4', 5', 20, 21 in a controller. A controller with ten coils is shown herein. The position of the coils is shown in broken lines. Each coil has two short lead wires 15, 16 which all end in press-in pins. The lead wires of the outward coils 2, 3, 4, 5; 2', 5'; 20, 21 are directed inwardly, and the lead wires of the two inward coils 3', 4' are directed outwardly so that the lead wires are placed in an area 26 which is considerably smaller than the area comprised by the coils. The dimensions of the printed circuit board 8 can be accordingly small.

Figure 5:
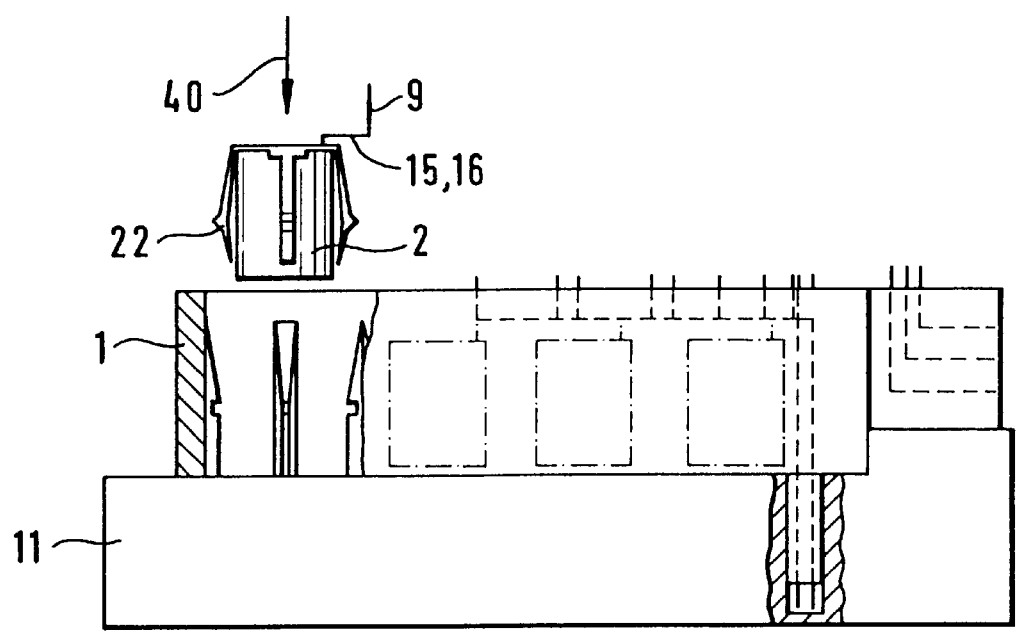
FIG. 5 is an alternative assembly possibility.

FIG. 5 shows another possibility of assembly of coils 2, 3, 4, 5. The partition wall 10 has openings (not shown herein) which are as large as the diameter of the coils being inserted. Thus, the coils can be inserted from above (see arrow 40), i.e., from the side where the printed circuit board 8 is later mounted. The advantage which results is that the lead wires 15, 16 can be bent already prior to the assembly and the ends of the lead wires can be mounted in their correct position onto the bases already during the assembly of the valve coils.

Thus, the assembly step with respect to FIG. 1b is omitted in this arrangement where the lead wires are deflected only after the assembly of the valve coils. Further, there is the possibility of a direct assembly on the valve block 11 and, thus, an integration into the usual production line.

What is claimed is:

1. A brake control unit comprising:

a housing having a frame;

coils for electromagnetically actuatable valves of a hydraulic brake system;

a printed circuit board on which electronic devices are mounted and which includes a plurality of press-in holes, wherein the coils are connected to the electronic devices on the printed circuit board by way of lead wires having respective ends thereof configured to be received in corresponding press-in holes, and the coils are attached below a partition wall in the frame and the lead wires are inserted through an opening in the partition wall, the lead wires having a first bend above the opening wherein portions of the lead wires between the partition wall and the printed circuit board extend in parallel to the partition wall; the lead wires having a second bend at their ends in a direction toward the printed circuit board, wherein the ends of the lead wires are pressed into the press-in holes in the printed circuit board, and wherein to take up a press-in force, the second bends of the lead wires are supported on a support base which is arranged between the partition wall and the printed circuit board and makes the ends align with the press-in holes in the printed circuit board, the portions of the lead wires between the first and second bends being laid uncovered.

2. The brake control unit as claimed in claim 1, wherein lead wires of one of the coils have a plastic holder that positions the lead wires with respect to each below their ends.

3. The brake control unit as claimed in claim 1, wherein the end of each lead wire includes locking arms.

4. The brake control unit as claimed in claim 1, wherein the support bases are configured for one of (i) supporting a plastic holder that maintains a relative position between the lead wires and (ii) retaining lead wires having locking arms for which such support bases have corresponding catching hooks.

5. The brake control unit as claimed in claim 1, wherein the support bases fix the ends of the lead wires at least in one direction vertically to the portion of the lead wires which extend in parallel to the partition wall.

6. The brake controller unit as claimed in claim 1, wherein all coils have lead wires of equal length.

7. The brake control unit as claimed in claim 1, wherein the openings are of such dimensions that the coils can be inserted from a side of the frame into which the printed circuit board is mounted.

* * * * *